(12) United States Patent
Humbert et al.

(10) Patent No.: US 11,676,851 B2
(45) Date of Patent: Jun. 13, 2023

(54) METHOD FOR MANUFACTURING A FLUID SENSOR DEVICE AND A FLUID SENSOR DEVICE

(71) Applicant: IMEC VZW, Leuven (BE)

(72) Inventors: Aurelie Humbert, Schaarbeek (BE); Simone Severi, Leuven (BE)

(73) Assignee: IMEC VZW, Leuven (BE)

( * ) Notice: Subject to any disclaimer, the term of this patent is extended or adjusted under 35 U.S.C. 154(b) by 0 days.

(21) Appl. No.: 16/957,090

(22) PCT Filed: Dec. 19, 2018

(86) PCT No.: PCT/EP2018/085864
§ 371 (c)(1),
(2) Date: Jun. 22, 2020

(87) PCT Pub. No.: WO2019/121931
PCT Pub. Date: Jun. 27, 2019

(65) Prior Publication Data
US 2020/0350200 A1    Nov. 5, 2020

(30) Foreign Application Priority Data
Dec. 22, 2017 (EP) .................................. 17210420

(51) Int. Cl.
*H01L 21/762* (2006.01)
*G01N 27/414* (2006.01)

(52) U.S. Cl.
CPC ... *H01L 21/76251* (2013.01); *G01N 27/4145* (2013.01); *G01N 27/4146* (2013.01); *G01N 27/4148* (2013.01)

(58) Field of Classification Search
None
See application file for complete search history.

(56) References Cited

U.S. PATENT DOCUMENTS 6,242,324 B1 * 6/2001 Kub .................... H01L 27/0688
                                                         438/455
9,810,660 B2    11/2017 Hu et al.
(Continued)

FOREIGN PATENT DOCUMENTS

DE        10254158 A1    6/2004

OTHER PUBLICATIONS

Takeuchi H Et al. "Thermal Budget Limits of Quarter-Micrometer Foundry CMOS for Post-Processing MEMS Devices", IEEE Transactions on Electron Devices, IEEE Service Center, Pisacataway, NJ, US. vol. 52, No. 9, Sep. 2, 2005, p. 2081-2086, XP011138322, ISSN-0018-9383, DOI; 10.1109/TED.2005.854287 abstract.
(Continued)

*Primary Examiner* — Erik Kielin
(74) *Attorney, Agent, or Firm* — Moser Taboada (57) ABSTRACT

According to an aspect of the present inventive concept there is provided a method for manufacturing a fluid sensor device comprising: bonding a silicon-on-insulator arrangement comprising a silicon wafer, a buried oxide, a silicon layer, and a first dielectric layer, to a CMOS arrangement comprising a metallization layer and a planarized dielectric layer, wherein the bonding is performed via the first dielectric layer and the planarized dielectric layer; forming a fin-FET arrangement in the silicon layer, wherein the fin-FET arrangement is configured to function as a fluid sensitive fin-FET arrangement; removing the buried oxide and the silicon wafer; forming a contact to the metallization layer and the fin-FET arrangement, wherein the contact comprises an interconnecting structure configured to interconnect the metallization layer and the fin-FET arrangement; forming a channel comprising an inlet and an outlet, wherein the channel is configured to allow a fluid comprising an analyte to contact the fin-FET arrangement.

13 Claims, 11 Drawing Sheets

(56) References Cited

U.S. PATENT DOCUMENTS

| | | | | |
|---|---|---|---|---|
| 2008/0283995 | A1* | 11/2008 | Bucki | H01L 25/0657 257/690 |
| 2009/0152596 | A1* | 6/2009 | Yang | G01N 27/4145 257/253 |
| 2010/0066348 | A1* | 3/2010 | Merz | C12Q 1/6869 324/71.1 |
| 2011/0263036 | A1* | 10/2011 | Blauw | G01N 27/4146 436/149 |
| 2012/0161333 | A1 | 6/2012 | Aurelie et al. | |
| 2015/0268189 | A1 | 9/2015 | Sara et al. | |
| 2017/0059514 | A1* | 3/2017 | Hoffman | G01N 33/5438 |
| 2017/0102356 | A1* | 4/2017 | Lin | G01N 27/4145 |

OTHER PUBLICATIONS

M. Sengupta et al. "Effects of Rapid Thermal Annealing Temperature on Performances of Nanoscale FinFETs", JSTS; Journal of Semiconductor Technology and Science, vol. 9, No. 4, Dec. 20, 2009, p. 266-272, XP055472188, ISSN; 1598-1657, DOI: 10.5573/JSTS.2009.9.4.266 abstract p. 268, left hand column, paragraph 1.

Rigante S et al. "Low power finfet ph-sensor with high-sensitivity voltage readout", 2013 Proceedings of the European Solid-State Device Research Conference (ESSDERC), IEEE, Sep. 16, 2013, p. 350-353, XPO32596950, DOI; 10.1109/ESSDERC.2013.6818890 abstract; figure 1-7 p. 350, left hand column, para 4—right hand column, para 2.

Mansoor et al. "An SOI CMOS-Based Multi-Sensor MEMS Chip for Fluidic Applications" Sensors, vol. 16, No. 11, Nov. 4, 2016, p. 1608, XP055411629, DOI-10.3390/s16111608 abstract; figures 1-9 p. 4, paragraph 3.

International Search Report for PCT/EP2018/085864, dated Mar. 18, 2019.

Extended European Search Report for Application No. 17210420.0 dated May 14, 2018.

* cited by examiner

METHOD FOR MANUFACTURING A FLUID SENSOR DEVICE AND A FLUID SENSOR DEVICE

TECHNICAL FIELD

The present inventive concept generally relates to the field of semiconductor device fabrication, and in particular to a method for manufacturing a fluid sensor device and a fluid sensor device.

BACKGROUND

There exist devices, such as fluid sensor devices, utilizing field-effect transistors (FET) for sensing of bio or gas molecules. Such devices often incorporate FETs gated by changes in the surface potential induced by binding of molecules, and may be used in fields such as medical diagnostics, biological research, environmental protection and food analysis.

There is a need to improve fluid sensor devices, in particular with respect to size, sensing, and manufacturing.

SUMMARY

It is an object of the present inventive concept to provide an improvement of fluid sensor devices and enable an increased versatility of fluid sensor devices.

This and other objects of the present inventive concept are at least partly met by the invention as defined in the independent claims. Preferred embodiments are set out in the dependent claims.

According to a first aspect, there is provided a method for manufacturing a fluid sensor device, the method comprising: bonding a silicon-on-insulator arrangement comprising a silicon wafer, a buried oxide, a silicon layer, and a first dielectric layer, to a CMOS arrangement comprising a metallization layer and a planarized dielectric layer, wherein the bonding is performed via the first dielectric layer and the planarized dielectric layer; removing the buried oxide and the silicon wafer; forming a fin-FET arrangement in the silicon layer, wherein the fin-FET arrangement is configured to function as a fluid sensitive fin-FET arrangement; forming a contact to the metallization layer and the fin-FET arrangement, wherein the contact comprises an interconnecting structure configured to interconnect the metallization layer and the fin-FET arrangement; forming a channel comprising an inlet and an outlet, wherein the channel is configured to at least partially expose the fin-FET arrangement and to allow a fluid comprising an analyte to contact the fin-FET arrangement.

In general, the present inventive concept makes use of a fin-FET arrangement which is stacked on a CMOS arrangement. The fin-FET arrangement may provide a function as a fluid sensitive fin-FET arrangement. By forming the fin-FET arrangement on the CMOS arrangement, a stacked configuration may be formed, which allows forming of a very compact fluid sensor device.

The CMOS arrangement may provide additional functionality to the fin-FET arrangement, e.g. the CMOS arrangement may comprise signal processing functionality to a signal acquired by the fin-FET arrangement. For example, the CMOS arrangement may provide an amplifying structure configured to amplify a signal from the fin-FET arrangement.

Further, by means of arranging the fin-FET arrangement on the CMOS arrangement, a fluid sensor device having a small surface area footprint may be provided. Also, by means of arranging the fin-FET arrangement on the CMOS arrangement, a fluid sensor device for single molecule detection may be realized. This may be especially useful for providing a dense arrangement of adjacent fin-FET arrangements, since signal processing circuitry for each fin-FET arrangement may be provided below the fin-FET arrangements rather than between the fin-FET arrangements.

The term "fluid sensitive fin-FET arrangement" is to be understood as a fin-FET arrangement sensor sensitive to molecules, substances, or more generally an analyte in a fluid.

The dielectric layers referred to in the present disclosure may comprise an oxide and/or any other dielectric material such as SiOC, SiN etc.

It will be understood that when a component, such as a layer, a film, a region, or a plate, is referred to as being "on" or "over" another component, the component may be directly on the other component or intervening components may be present thereon. In particular, it is to be understood that the microfluidic structure need not necessarily be bonded to the third dielectric layer, but in contrast to any layer suitable for bonding to the microfluidic structure.

Further, it will be understood that some parts of the processes in the present disclosure may be omitted for the sake of brevity. In particular, some steps of masking, patterning, or etching may be omitted since it is believed that the person skilled in the art understands from the present disclosure as a whole how these steps are to be carried out within the present inventive concept.

The metallization layer referred to in the present disclosure may refer to a back end of line layer. However, as is readily understood by the person skilled in the art, the CMOS arrangement may comprise several metallization layers.

The CMOS arrangement may comprise an amplifying structure configured to amplify a signal from the fin-FET arrangement. The amplifying structure may be a transimpedance amplifier. The amplifying structure may be configured to convert a current signal into a voltage signal.

The metallization layer may be configured to provide contact to the amplifying structure of the CMOS arrangement. Hereby, the fin-FET arrangement may be in communicative contact with the amplifying structure of the CMOS arrangement.

The method may further comprise forming a second dielectric layer over the fin-FET arrangement, and wherein the contact to the metallization layer and the fin-FET arrangement is configured to be at least partially enclosed by the planarized dielectric layer and the second dielectric layer. Hereby, a contact comprising a first vertical portion configured to be in contact with the fin-FET arrangement, a second vertical portion configured to be in contact with the metallization layer, and a horizontal interconnecting structure configured to interconnect the metallization layer and the fin FET arrangement, may be achieved.

The method may further comprise forming a third dielectric layer over the contact and the fin-FET arrangement.

The second and third dielectric layer may form part of the channel. The channel may be a microfluidic channel. Hereby, a channel comprising a sample chamber may be formed. The sample chamber may provide an increased volume for the fluid comprising the analyte.

It is to be understood that even though the present disclosure refers to e.g. a second and a third dielectric layer, the two layers need not necessarily be separate dielectric layers. In contrast, the second and third dielectric layer may be formed in a single step.

Further, it is envisioned that a sample chamber providing an increased volume for the fluid comprising the analyte may be provided in other ways, e.g. by the microfluidic structure referred to in the following paragraph.

The step of forming the channel may comprise removing a portion of the second and third dielectric layer, and bonding a microfluidic arrangement to the third dielectric layer. The bonding may be a fusion bonding. The microfluidic arrangement may provide additional microfluidic structures which may not be possible or preferable to form e.g. over the fin-FET arrangement. For example, the microfluidic arrangement may comprise at least part of the inlet and outlet of the channel. It is to be understood that the microfluidic structure need not necessarily be bonded to the third dielectric layer, instead the microfluidic arrangement may be bonded to any layer capable of forming a bond with the microfluidic arrangement. In this regard, the step of forming the channel may comprise removing a portion of the second dielectric layer, in case the third dielectric layer is not present.

The contact may comprise a vertical arrangement comprising a first vertical portion configured to be in contact with the fin FET-arrangement, and a second vertical portion configured to be in contact with the metallization layer, wherein the interconnecting structure is configured to connect the metallization layer and the fin-FET arrangement via the vertical arrangement. The vertical arrangement may comprise tungsten. The interconnecting structure may comprise aluminum.

The method may further comprise forming an etch stop layer over the fin-FET arrangement prior to the step of forming the contact to the metallization layer and the fin-FET arrangement. The etch stop layer may act as a protective layer for the fin-FET arrangement. In particular, the etch stop layer may facilitate the forming of the channel.

The etch stop layer may comprise a material selected from the group consisting of SiN, metal oxides, and metal.

The etch stop layer may be at least partially removed in conjunction with forming the channel, and a metal oxide layer may thereafter be formed over the fin-FET arrangement. This may be advantageous in case the etch stop layer is damaged or of poor quality due to the forming of the channel. The etch stop layer may be completely removed before forming the metal oxide layer over the fin-FET arrangement. In such case, the etch stop layer may be formed in any type of material suitable to act as an etch stop, as the etch stop layer is anyway completely removed later. The metal oxide layer may comprise AlO, HfO, SiO or similar materials. The metal oxide layer may provide a gate dielectric on the fin-FET arrangement.

A portion of the interconnecting structure may be exposed in order to form a bond pad opening. Hereby, the fluid sensor device may be connected to other devices.

According to the first aspect, the step of forming a fin-FET arrangement in the silicon layer may be performed after the step of bonding the silicon-on-insulator arrangement to the CMOS arrangement, and after the step of removing the buried oxide and the silicon wafer. Hereby, the removing of the buried oxide and the silicon wafer may not risk affecting a structure of the fin-FET arrangement.

However, it is realized that an alternative order of steps may be provided in a method for manufacturing the fluid sensor device. Thus, according to an alternative, the forming of the fin-FET arrangement may be performed prior to the fin-FET arrangement being bonded to the CMOS arrangement.

Thus, according to a second aspect, there is provided a method for manufacturing a fluid sensor device, the method comprising: forming a fin-FET arrangement in a silicon layer of a silicon-on-insulator arrangement, comprising a silicon wafer, a buried oxide and the silicon layer, wherein the fin-FET arrangement is configured to function as a fluid sensitive fin-FET arrangement; bonding the silicon-on-insulator arrangement to a temporary carrier; removing the silicon wafer; bonding the temporary carrier to a CMOS arrangement comprising a metallization layer and a planarized dielectric layer, wherein the bonding is performed via a dielectric layer of the silicon-of-insulator arrangement, such as the buried oxide, and the planarized dielectric layer; removing the temporary carrier; forming a contact to the metallization layer and the fin-FET arrangement, wherein the contact comprises an interconnecting structure configured to interconnect the metallization layer and the fin-FET arrangement; forming a channel comprising an inlet and an outlet, wherein the channel is configured to at least partially expose the fin-FET arrangement and to allow a fluid comprising an analyte to contact the fin-FET arrangement.

Thus, according to the second aspect, a thin film transfer process may be used, wherein a fin-FET arrangement formed on the silicon-on-insulator arrangement is transferred via the temporary carrier to be bonded to the CMOS arrangement.

Similar to the first aspect, the method of the second aspect provides a fin-FET arrangement which is stacked on a CMOS arrangement. The fin-FET arrangement may provide a function as a fluid sensitive fin-FET arrangement. By forming the fin-FET arrangement on the CMOS arrangement, a stacked configuration may be formed, which allows forming of a very compact fluid sensor device.

According to the second aspect, the step of forming a fin-FET arrangement in the silicon layer may be performed prior to the step of bonding the fin-FET arrangement to the CMOS arrangement. This order of processing may be advantageous when forming a fin-FET arrangement comprising at least one nanopore fin-FET. Hereby, the CMOS arrangement is not affected by the procedure or procedures used to form the fin-FET arrangement. In particular, a higher resolution of the fin-FET arrangement may be achieved. Further, higher temperatures are possible to be used in the forming of the fin-FET arrangement without risking damage to the CMOS arrangement.

Also, it should be realized that structures in relation to the fin-FET arrangement may be formed on the silicon-on-insulator arrangement before the fin-FET arrangement is transferred to be bonded to the CMOS arrangement.

For instance, the fin-FET arrangement may be prepared with structures facing away from the CMOS arrangement, since such structures may be arranged above the fin-FET arrangement on the silicon-on-insulator arrangement and may be transferred to be bonded to the CMOS arrangement facing away from the CMOS arrangement. The fin-FET arrangement on the silicon-on-insulator arrangement may further be provided with a planarized dielectric layer for facilitating bonding to the temporary carrier.

The fin-FET arrangement may for instance prior to bonding of the silicon-on-insulator arrangement to the temporary carrier be provided with a pre-metal dielectric layer through which connections e.g. to gates, source and drain areas in the fin-FET arrangement may be formed.

It should be realized that the bonding of the fin-FET arrangement on the temporary carrier to the CMOS arrangement may be performed using the oxide of the buried oxide layer of the silicon-on-insulator arrangement. Thus, after the silicon-on-insulator arrangement has been bonded to the temporary carrier, the buried oxide may be substantially removed in order to maintain a layer of the buried oxide to enable bonding to the CMOS arrangement. Alternatively, the entire buried oxide may be maintained and used in bonding to the CMOS arrangement. As yet another alternative, the buried oxide may be completely removed and another dielectric layer may be arranged on the temporary carrier for enabling bonding of the temporary carrier to the CMOS arrangement.

It should be realized that features described above with regard to the CMOS arrangement are equally applicable to the method of the second aspect. Similarly, features described above in relation to the contact to interconnect the metallization layer and the fin-FET arrangement are equally applicable to the method of the second aspect. Similarly, features described above in relation to forming the channel are equally applicable to the method of the second aspect.

The fin-FET arrangement may comprise nanopore fin-FETs. It is to be understood that the fin-FET arrangement may comprise at least one nanopore fin-FET. The nanopore fin-FETs may provide for that a fluid sensor device having a high sensitivity for molecule detection is achieved.

The operating principle of a nanopore fin-FET may be essentially the same as a traditional fin-FET.

A fin-FET arrangement comprising at least one nanopore fin-FET may be achieved by forming and patterning a sacrificial layer, which when removed leaves a small pore, e.g. a nanopore. Other techniques may also be used to form a nanopore, such as ion/electron-beam sculpturing. It may be noted that different arrangements of nanopores are envisioned, such as arrays of nanopores enabling parallel sensing at high speed.

The nanopore may advantageously be arranged in a gate area of a fin-FET structure or in a gate area of a structure corresponding to a fin-FET structure. An analyte passing the pore may modulate the source-drain current of the nanopore fin-FET, thus giving rise to a signal in the fluid sensor device. The nanopore of a nanopore fin-FET may have a diemeter of less than 10 nm, such as less than 5 nm.

By means of using a nanopore fin-FET, a very high sensitivity for molecule detection may be accomplished.

The method according to the second aspect may be particularly suitable for forming of a fin-FET arrangement comprising nanopore fin-FETs.

According to a third aspect, there is provided a fluid sensor device comprising: a CMOS arrangement comprising a metallization layer; a fin FET arrangement configured to function as a fluid sensitive fin FET arrangement and to generate a fluid sensor signal, wherein the fin FET arrangement is arranged over the CMOS arrangement; a contact to the metallization layer and the fin FET arrangement, wherein the contact comprises an interconnecting structure configured to interconnect the metallization layer and the fin FET arrangement; wherein the fin FET arrangement is configured to transfer the fluid sensor signal to the CMOS arrangement via the interconnecting structure, and wherein the CMOS arrangement is configured to process the fluid sensor signal; and wherein the fluid sensor device further comprises a channel comprising an inlet and an outlet, wherein the fin FET arrangement is configured to be at least partially exposed in the channel to allow a fluid comprising an analyte to contact the fin FET arrangement.

Effects and features of this third aspect are largely analogous to those described above in connection with the first and second aspects. Embodiments mentioned in relation to the first and second aspects are largely compatible with the third aspect.

The fluid sensor device may provide a sensor equipment for analyzing an analyte in a fluid. The analyte may be any substance in a fluid, such as a biological substance, e.g. a DNA or RNA string, or any other substance, compound, or single molecule. The fin-FET arrangement utilizes the fact that an analyte contacting the fin-FET arrangement may change a charge of a gate of the fin-FET arrangement such that a conductance in the fin-FET arrangement is changed. This may cause a current to flow from source to drain in a transistor of the fin-FET arrangement such that a fluid sensor signal may be generated. The fluid sensor signal may be transferred to the CMOS arrangement for further processing, such as amplifying of the fluid sensor signal. Thanks to the fin-FET arrangement being arranged over the CMOS arrangement, a fluid sensor device having a small surface area footprint may be provided.

BRIEF DESCRIPTION OF THE DRAWINGS

The above, as well as additional objects, features and advantages of the present inventive concept, will be better understood through the following illustrative and non-limiting detailed description, with reference to the appended drawings. In the drawings like reference numerals will be used for like elements unless stated otherwise.

DETAILED DESCRIPTION

Figure 1A:
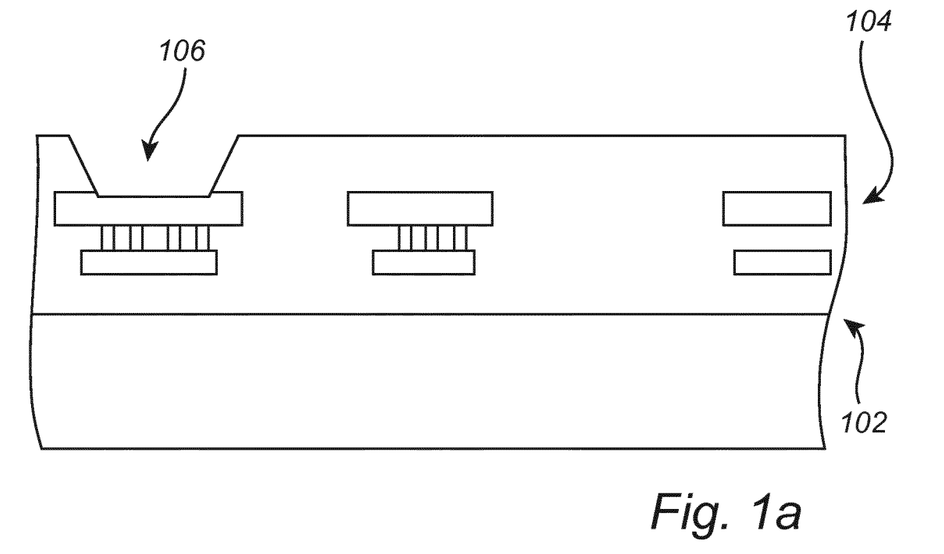
FIGS. 1a-1r illustrate steps which may form part of a method for manufacturing a fluid sensor device according to a first embodiment, wherein some steps are also applicable to a second embodiment.
Figure 1B:
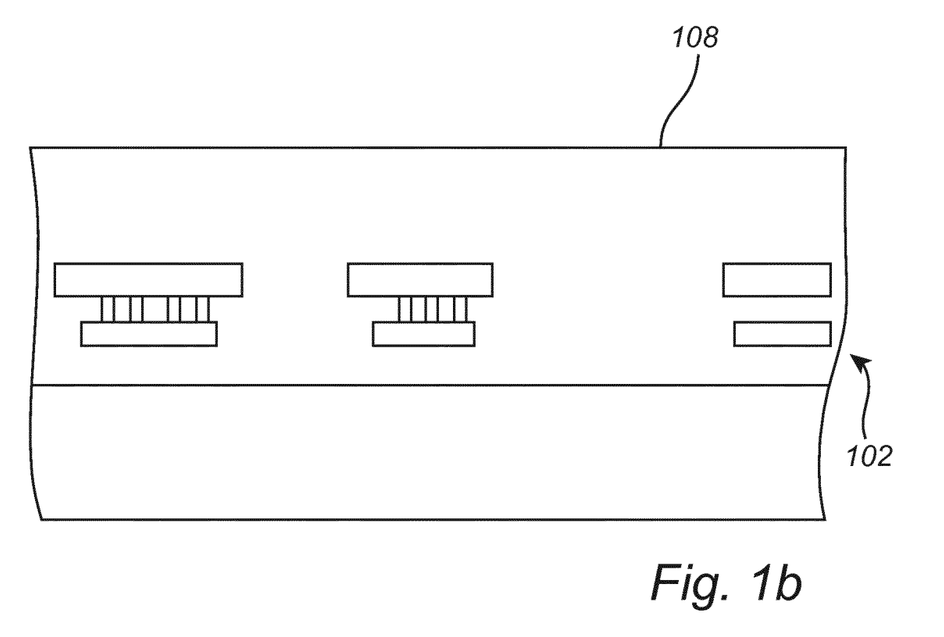
Figure 1C:
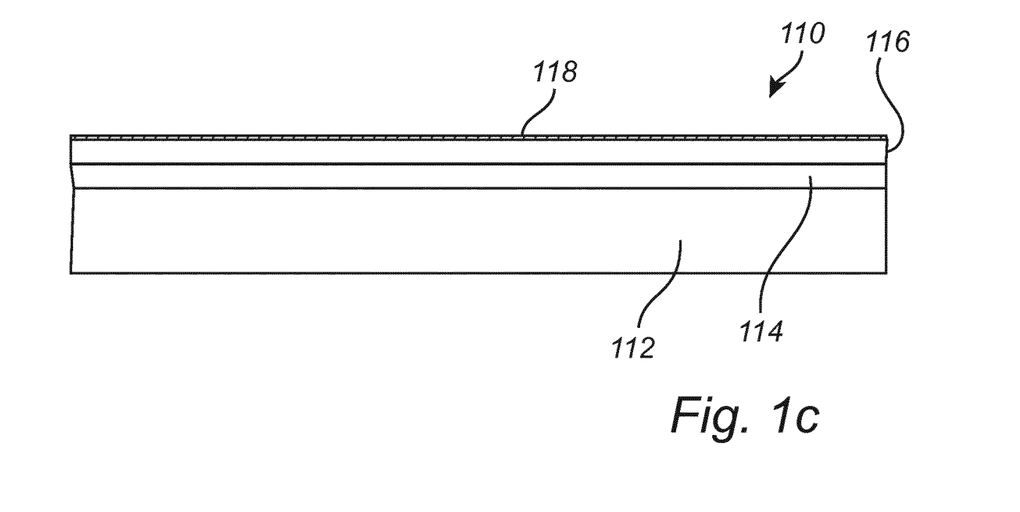
Figure 1D:
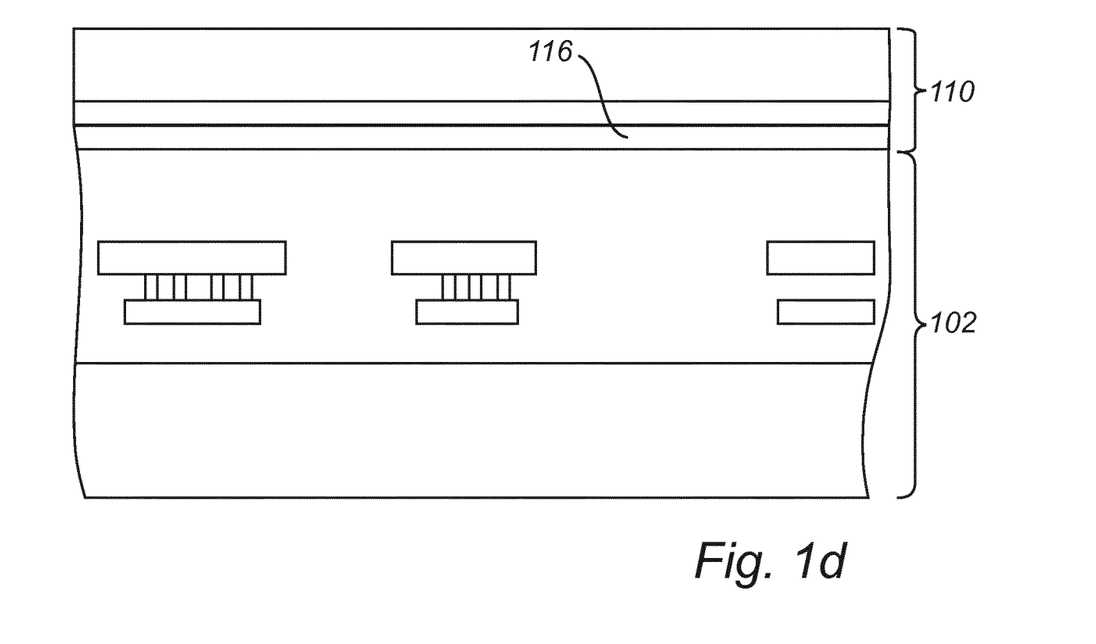
Figure 1E:
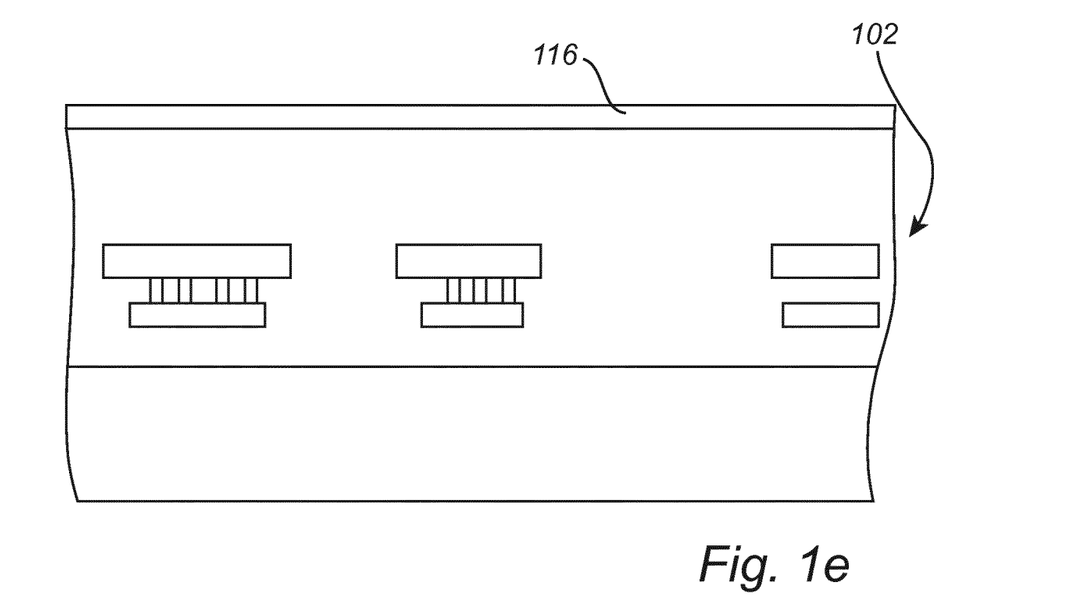
Figure 1F:
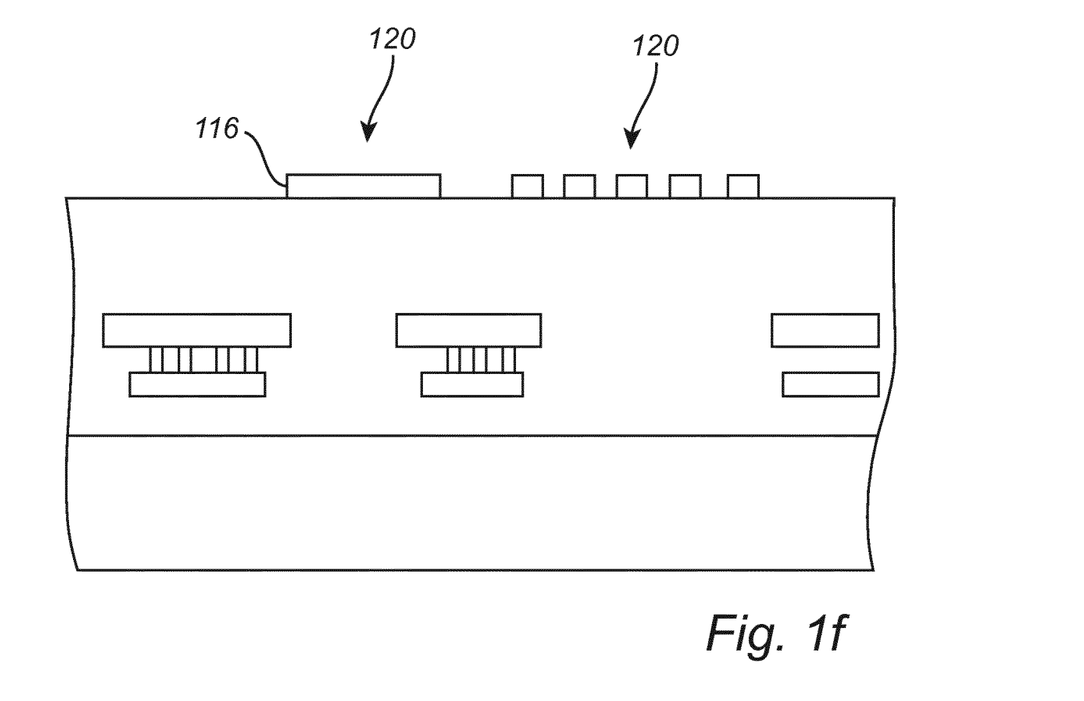
Figure 1G:
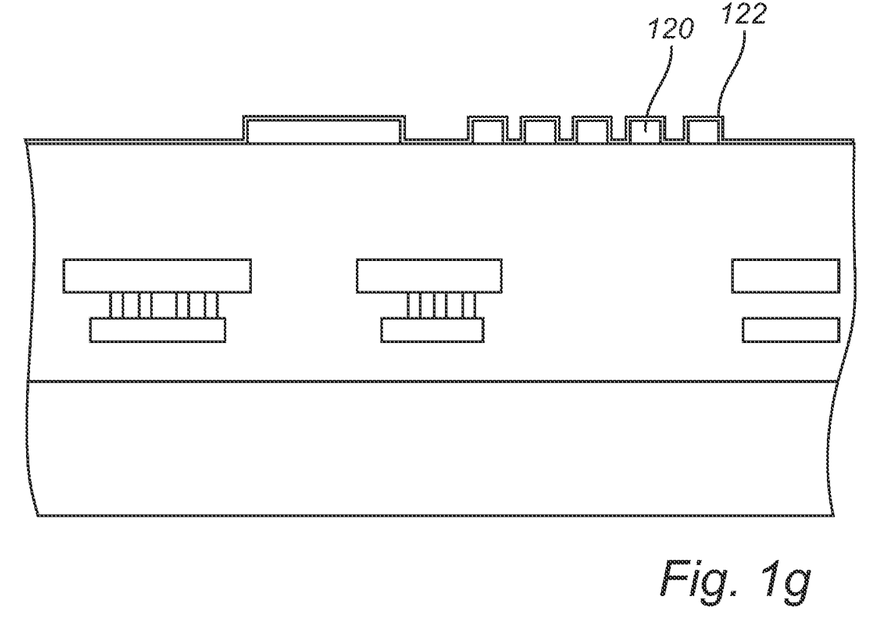
Figure 1H:
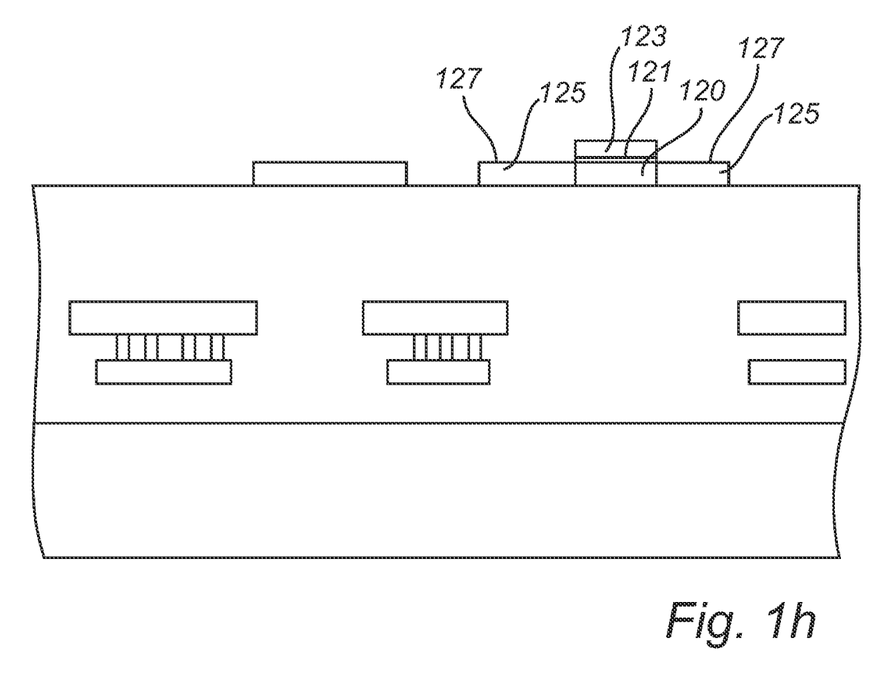
Figure 1I:
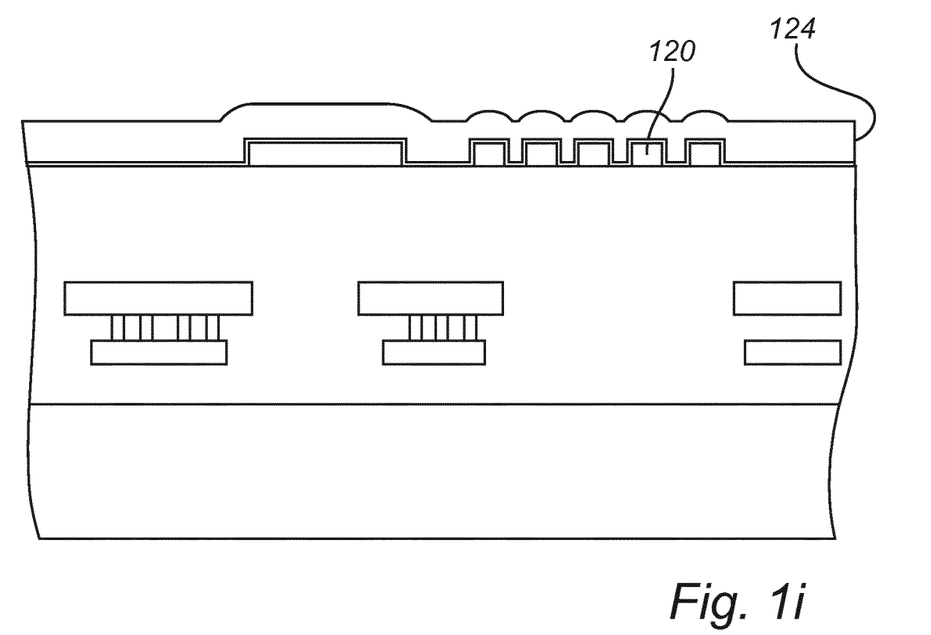
Figure 1J:
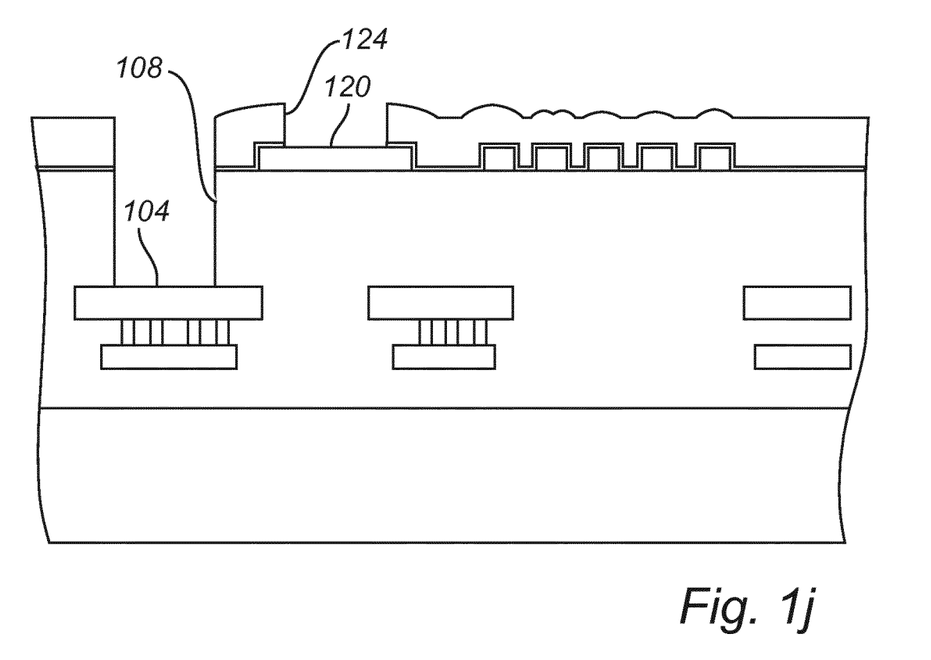
Figure 1K:
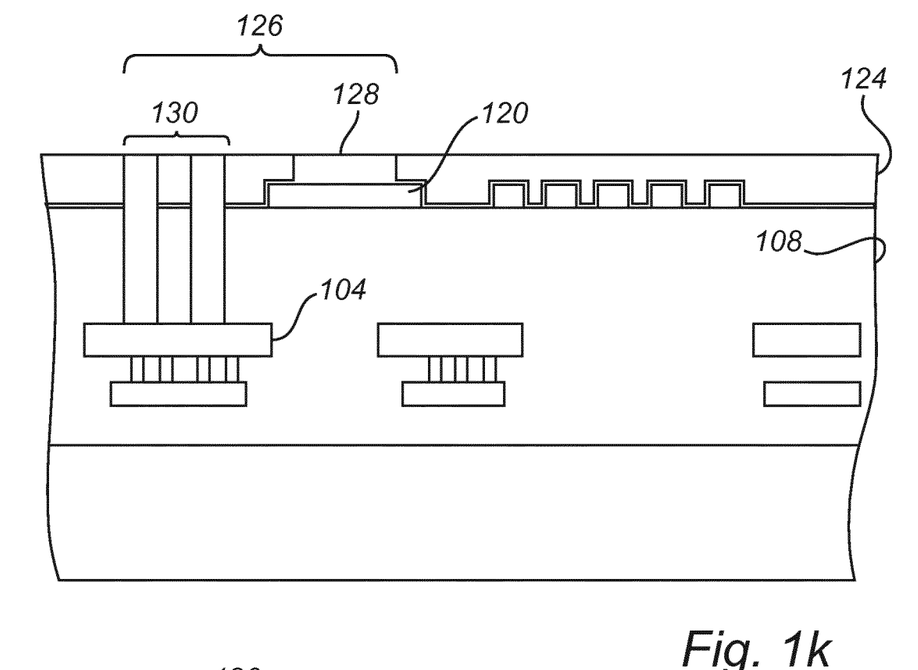
Figure 1M:
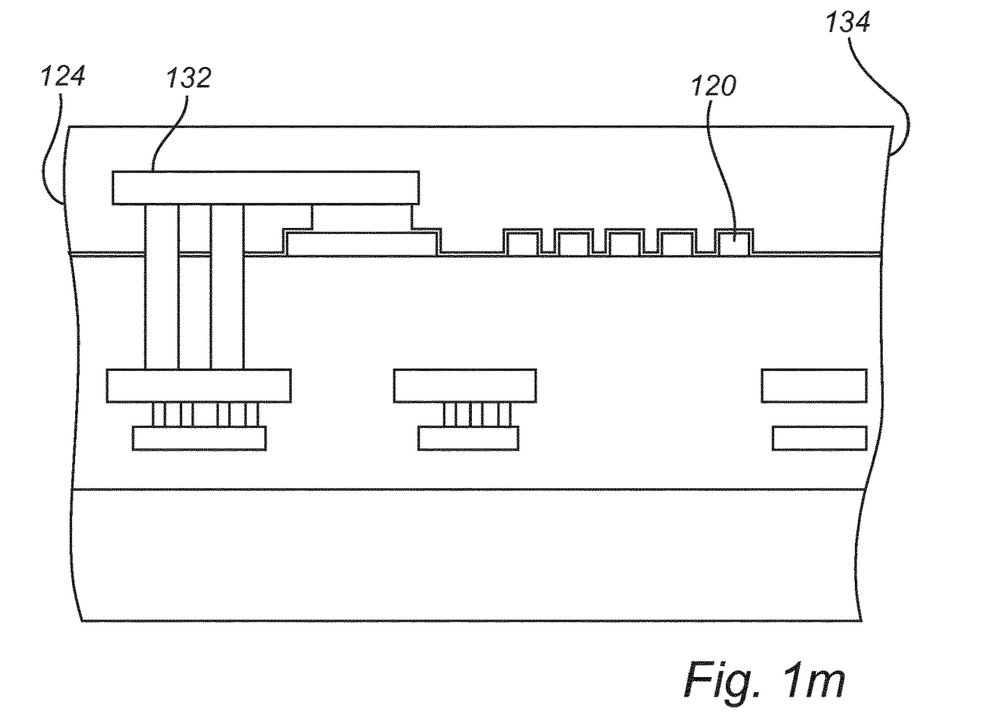
Figure 1N:
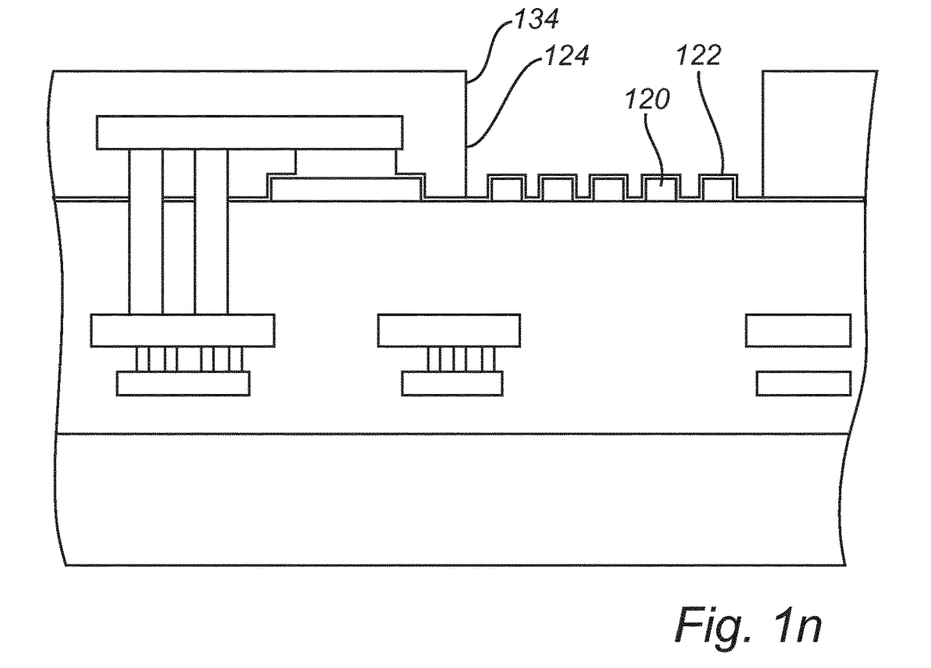
Figure 1O:
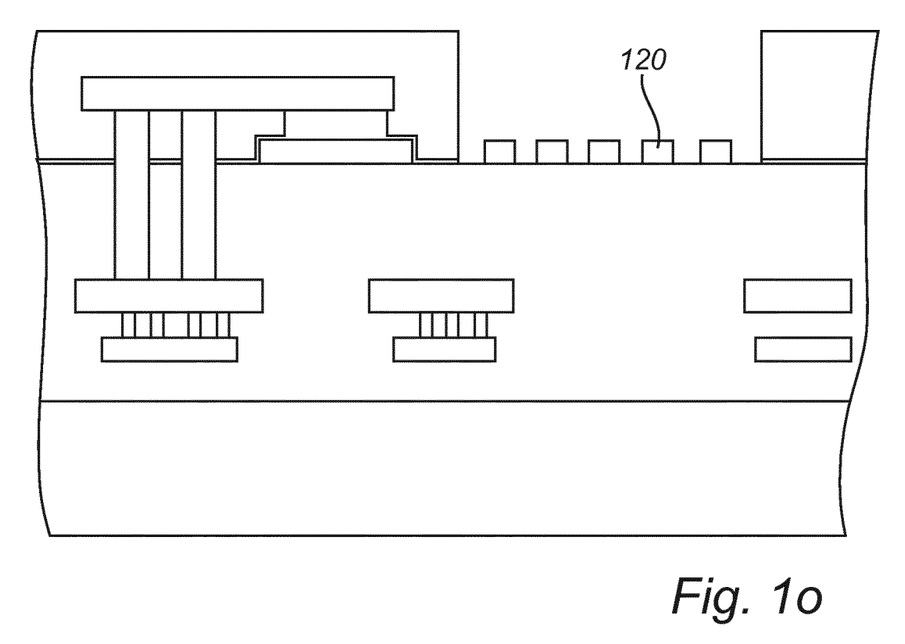
Figure 1P:
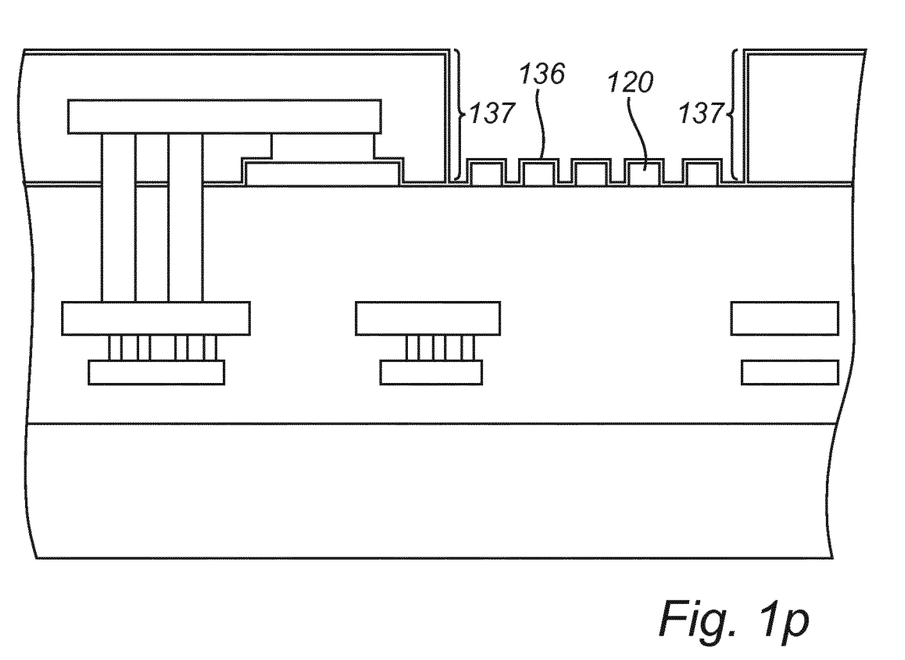
Figure 1Q:
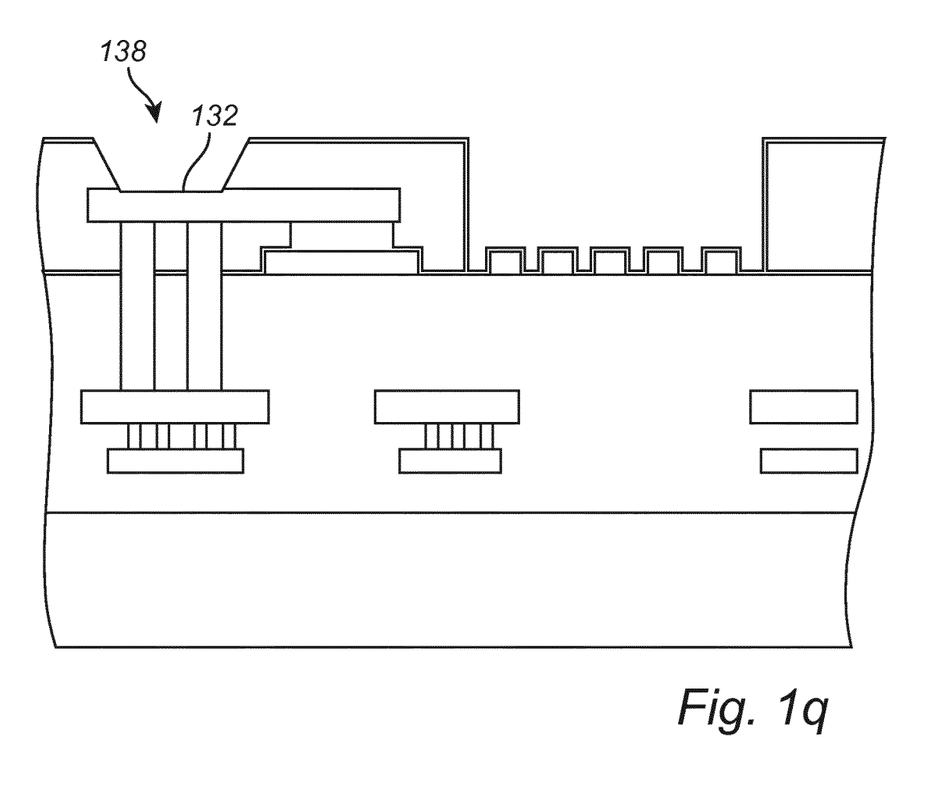
Figure 1R:
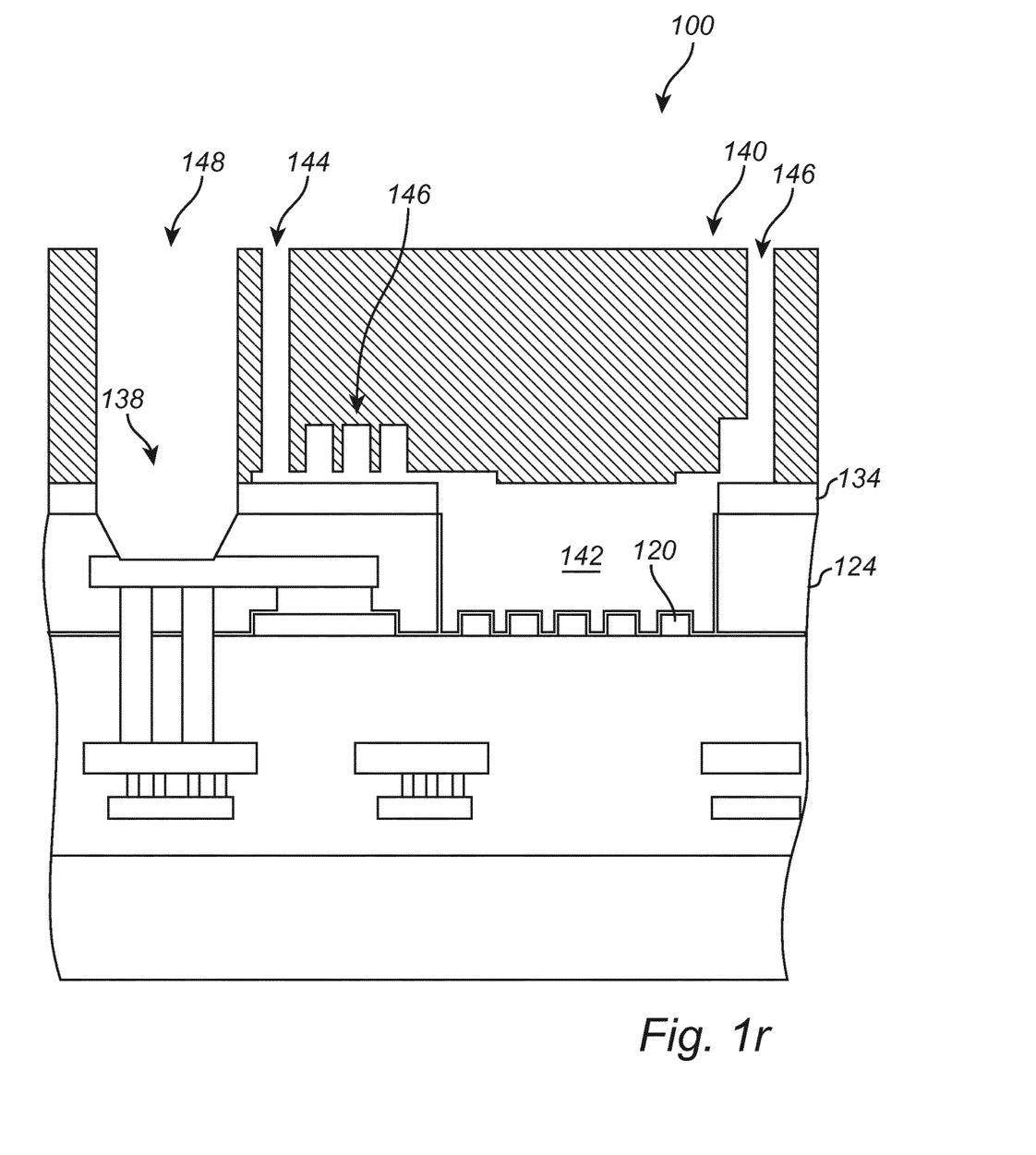

FIGS. 1a-1r illustrate steps which may form part of a method for manufacturing a fluid sensor device. Again, it may be noted that some parts of the processes in the present disclosure may be omitted for the sake of brevity. In particular, some steps of masking, patterning, or etching may be omitted since it is believed that the person skilled in the art understands from the present disclosure as a whole how these steps are to be carried out within the present inventive concept. Further, the illustrations are schematic and not to scale. In particular, the thickness of some layers have been exaggerated in order to more clearly illustrate the composition of the fluid sensor device.

In relation to FIGS. 1a-1r, a method according to a first embodiment will be mainly described. However, as will be further discussed below, many of the steps illustrated for the method according to the first embodiment may also apply to a method according to a second embodiment. Therefore, the method according to the second embodiment will mainly be described in relation to steps that differ from the method according to the first embodiment.

Referring first to FIG. 1a, a CMOS arrangement 102 comprising a metallization layer arrangement comprising a metallization layer 104 is illustrated. As is readily understood by the person skilled in the art of semiconductor processing, the metallization layer arrangement may comprise several metallization layers. The metallization layer 104 may be an uppermost metallization layer. Typically, a CMOS arrangement comprises a CMOS bond pad opening 106 to the metallization layer in order to connect the CMOS arrangement to e.g. a packaged chip.

Referring now to FIG. 1b, a dielectric layer has been deposited over the CMOS arrangement 102. The dielectric layer may fill the CMOS bond pad opening. The dielectric layer may subsequently be planarized in order to form a planarized dielectric layer 108. The planarized dielectric layer 108 may provide a suitable surface for bonding to a silicon-on-insulator arrangement. Referring now to FIG. 1c, a silicon-on-insulator arrangement 110 comprising a silicon wafer 112, a buried oxide 114, and a silicon layer 116, is illustrated. A step of implantation and annealing of the silicon layer 116 may be performed. The dopant type and density may preferably be chosen according to application type of the fluid sensor device. The implantation and annealing may e.g. be used for forming source and drain contact implants, which may include annealing at a high temperature, such as 1000° C.

A native oxide 118 may be present at the surface of the silicon layer 116. The native oxide 118 may enable a fusion bonding process with the planarized dielectric layer of the CMOS arrangement. Alternatively or additionally, a thin dielectric layer 118 may be deposited on the silicon layer 116 in order to protect the silicon layer 116 and/or in order to enable the fusion bonding process.

It is envisioned that a forming of a fin-FET arrangement in the silicon layer 116 may be performed prior to bonding of the fin-FET arrangement to the CMOS arrangement. Such a step of forming may comprise patterning of the silicon layer 116. By forming the fin-FET arrangement in the silicon layer 116 prior to bonding of the silicon-on-insulator arrangement 110 to the CMOS arrangement, it is possible to utilize processes which would otherwise have damaged or degraded the CMOS arrangement. Hereby, a high resolution fin-FET arrangement may be achieved. The forming of the fin-FET arrangement prior to bonding will be further discussed below.

In the embodiment illustrated in FIGS. 1a-1h, the forming of the fin-FET arrangement in the silicon layer 116 is performed after bonding of the silicon-on-insulator arrangement 110 to the CMOS arrangement.

Referring now to FIG. 1d, the silicon-on-insulator arrangement 110 has been bonded to the CMOS arrangement 102. As can be seen, the silicon-on-insulator arrangement 110 is oriented such that the silicon layer 116 is closer to the CMOS arrangement 102 than the silicon wafer 112.

Referring now to FIG. 1e, the silicon wafer and buried oxide of the silicon-on-insulator arrangement has been removed. The removal may be performed by grinding or similar processes. However, it should be realized that the removal of the silicon wafer and buried oxide may alternatively be performed e.g. by etching. The silicon layer 116 is left on top of the CMOS arrangement 102.

Referring now to FIG. 1f, a forming of a fin-FET arrangement 120 in the silicon layer 116 has been performed. The fin-FET arrangement 120 may comprise several fin-FETs, which may respectively be arranged between a source and a drain of a transistor in the fin-FET arrangement 120. It should also be realized that a plurality of transistors comprising source, drain and fin-FETs therebetween may be formed in the fin-FET arrangement 120.

Referring now to FIG. 1g, an etch stop layer 122 has been formed over the fin-FET arrangement 120. The etch stop layer 122 may be formed via deposition. The etch stop layer 122 may protect the underlying structures from being etched in the subsequent manufacturing of the fluid sensing device.

In particular, the etch stop layer 122 may protect the fin-FET arrangement 120 from an etch process. Further, the etch stop layer 122 may protect the fin-FET arrangement 120 from substances, e.g. sodium, present in a fluid intended to be analyzed by the fluid sensor device.

Referring now to FIG. 1h, the fin-FET arrangement of FIG. 1g is illustrated in a lengthwise cross-section of a fin. Here, instead of forming an etch stop layer 122 as illustrated in FIG. 1g, a gate dielectric layer has been formed. The gate dielectric may be deposited e.g. using a plasma enhanced atomic layer deposition, which may be performed at a temperature lower than 400° C., so the processing to form the gate dielectric is within the thermal budget of the CMOS arrangement. Further, a gate 123 may be formed by amorphous silicon, which may also be deposited at a temperature lower than 400° C. However, as would be understood by the person skilled in the art, the deposition and materials used for the gate dielectric and the gate may be different while observing the thermal budget (i.e. temperature and time during which the temperature is provided) of the CMOS arrangement.

As further shown in FIG. 1h, source and drain regions may be formed based on the source and drain contact implants 127 formed in the silicon-on-insulator arrangement 110 prior to bonding. Extension implants 125 may be formed in the silicon layer 116 using a solid phase epitaxial regrowth (SPER) process so that source and drain regions may be formed in the silicon layer 116. For instance, for a positive metal-oxide-semiconductor (pMOS) device, boron implantation may be provided followed by a low temperature recristallation, e.g. 1 hour at 400° C.

However, as will be discussed below, at least some portions of the fin-FET arrangement may be configured for being in contact with a fluid for forming a fluid sensor. For such portions of the fin-FET arrangement, the gate oxide may be formed later and charges in the fluid may provide a gate signal, such that the fin-FET arrangement is not necessarily associated with a gate material. Also, it should be realized that the gate material 123 may function as an etch stop protecting the fin-FET arrangement 120 and gate dielectric so that the gate material 123 may later be removed for exposing the gate dielectric when the fin-FET arrangement is to be in contact with a fluid for forming a fluid sensor. As yet another alternative, the gate dielectric may be provided under the etch stop layer 122 and may be exposed by removal of the etch stop layer 122.

Referring now to FIGS. 2a-2d, alternative steps of a method according to the second embodiment will be described.

Figure 2A:
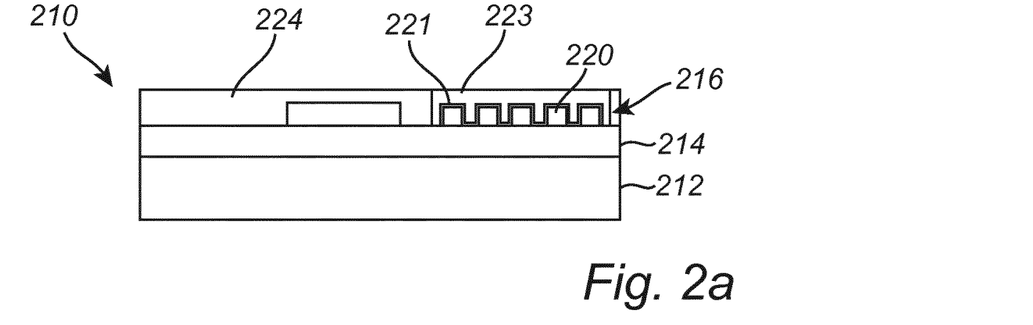
FIGS. 2a-2d illustrate steps which are particular to a method for manufacturing a fluid sensor device according to the second embodiment.

As illustrated in FIG. 2a, a fin-FET arrangement 220 may be formed on a silicon-on-insulator arrangement 210, comprising a silicon wafer 212, a buried oxide 214, and a silicon layer 216, in which the fin-FET arrangement 220 may be formed. Here, a gate dielectric 221 is illustrated arranged on the fin-FET arrangement 220 with a gate 221 arranged on the gate dielectric 221.

The silicon-on-insulator arrangement 210 may be processed in order to form structures up to forming of a pre-metal dielectric layer 224. Thus, the processing of the silicon-on-insulator arrangement 210 may involve etching to form fins, implantation and annealing of source and drain implants, and forming of gate oxide.

The formed structures may be passivated by deposition of the pre-metal dielectric layer 224, which may also protect the structures on the silicon-on-insulator arrangement 210 during following processing steps. Finally, the pre-metal dielectric layer 224 may be planarized.

As the silicon-on-insulator arrangement 210 has not yet been bonded to the CMOS arrangement, the processing of the silicon-on-insulator arrangement 210 may not need to take a thermal budget of the CMOS arrangement into account, which may for instance imply that small structures may be formed, such that the fin-FET arrangement 220 may include a nanopore fin-FET.

Figure 2B:
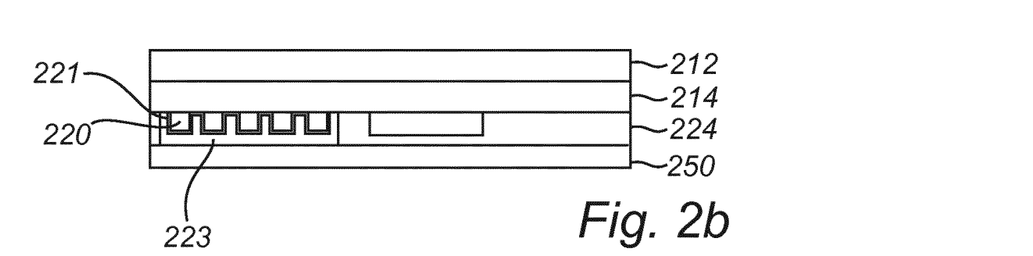

Referring now to FIG. 2b, the silicon-on-insulator arrangement 210 has been bonded to a temporary carrier 250, e.g. by fusion bonding. For instance, an oxide of the pre-metal dielectric layer 224 may be bonded to an oxide of the temporary carrier 250.

The temporary carrier 250 may provide a temporary substrate for carrying the fin-FET arrangement 220.

Figure 2C:
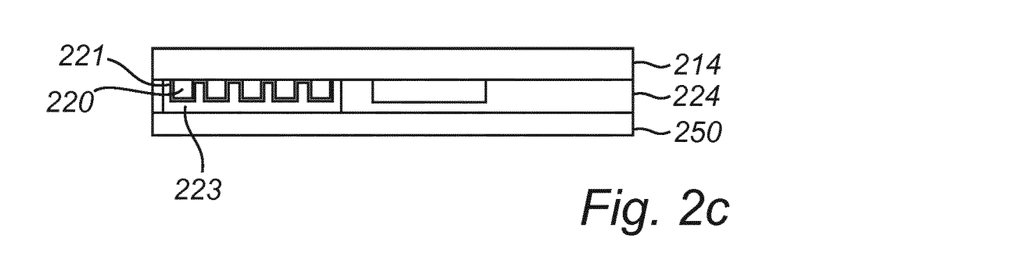

Referring now to FIG. 2c, the silicon wafer 212 has been removed. The removal may be performed by grinding or similar processes. However, it should be realized that the removal of the silicon wafer and buried oxide may alternatively be performed e.g. by etching. The buried oxide 214 may be left on top of the temporary carrier 250. However, according to an alternative the buried oxide 214 may be substantially removed in order to maintain only a thin layer of the buried oxide 214 to enable bonding to the CMOS arrangement. As yet another alternative, the buried oxide 214 may be completely removed and another dielectric layer may be arranged on the temporary carrier 250 for enabling bonding of the temporary carrier 250 to the CMOS arrangement.

Figure 2D:
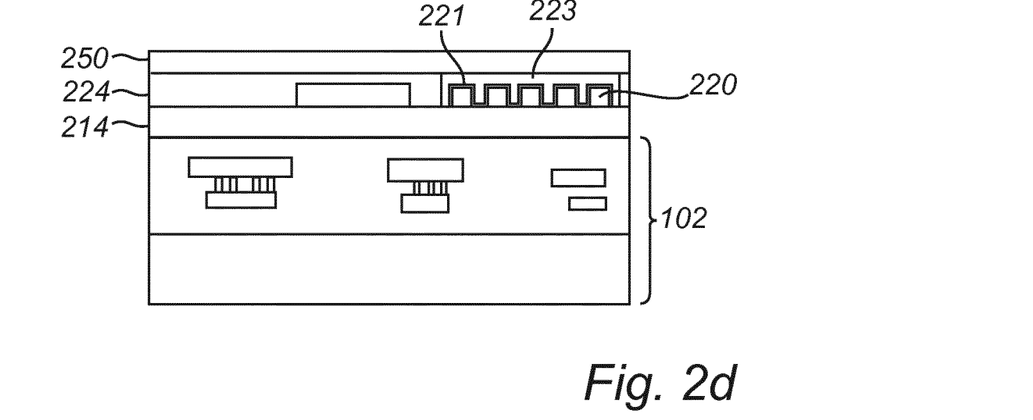

Referring now to FIG. 2d, the temporary carrier 250 has been bonded to the CMOS arrangement 202. As can be seen, the temporary carrier 250 is oriented such that the buried oxide 214 is closer to the CMOS arrangement 202 than the fin-FET arrangement 220. The structures formed on the buried oxide 214 in the step illustrated in FIG. 2a are hence arranged facing away from the CMOS arrangement 202 so as to e.g. allow access to source and drain contacts formed on the fin-FET arrangement 220.

The temporary carrier 250 may then be removed e.g. by providing a solvent for dissolving a glue with which the temporary carrier 250 is attached to the pre-metal dielectric layer 224 for lift-off of the temporary carrier 250. The bonding of the fin-FET arrangement 220 to the CMOS arrangement 202 via the temporary carrier 250 may thus provide a similar structure as provided by the forming of the fin-FET arrangement 120 after bonding of the silicon-on-insulator arrangement 110 to the CMOS arrangement as described above in relation to FIGS. 1a-1h. Hence, in the following, discussion will revert to FIG. 1i in relation to the method of the first embodiment.

It should be realized that the steps discussed in relation to FIGS. 1i-1r relate to using an etch stop layer 122 for protecting the fin-FET arrangement 120 from an etch process, which implies that the gate dielectric as described above in relation to FIG. 1h may instead be formed in a later step after the etch stop layer 122 has been removed. However, as an alternative, the gate 123 illustrated in FIG. 1h may act as an etch stop and may later be removed to expose the gate dielectric. Similarly, the gate 223 illustrated in FIGS. 2a-2d may also act as an etch stop and the discussion below in relation to FIGS. 1i-1r may equally well apply to the structure formed as illustrated in FIGS. 2a-2d.

Referring now to FIG. 1i, a second dielectric layer 124 has been formed over the fin-FET arrangement 120. The second dielectric layer 124 may fill gaps present in the fin-FET arrangement 120, and in particular between individual fin-FETs of the fin-FET arrangement 120. The second dielectric layer may protect the fin-FETs in processing to form connections between the fin-FET arrangement 120 and the CMOS arrangement 102.

This step may be optional when the fin-FET arrangement has been formed in accordance with the second embodiment, as the pre-metal dielectric layer 214 may already be provided on the fin-FET arrangement 220.

Referring now to FIG. 1j, a portion of the planarized dielectric layer 108 and the second dielectric layer 124 has been removed. Such a removal may be performed via a lithography process, which may include one or more lithography steps. The removal of a portion of the planarized dielectric layer 108 and the second dielectric layer 124 may expose a portion of the metallization layer 104 and a portion of the fin-FET arrangement 120.

Referring now to FIG. 1k, a contact 126 to the metallization layer 104 and the fin-FET arrangement 120 has been formed. The contact 126 may be at least partially enclosed by the planarized dielectric layer 108 and the second dielectric layer 124. Here, the contact 126 comprises a vertical arrangement comprising a first vertical portion 128 and a second vertical portion 130. The first vertical portion 128 is configured to be in contact with the fin-FET arrangement 120, and the second vertical portion 130 is configured to be in contact with the metallization layer 104.

Still referring to FIG. 1k, a planarization is also illustrated. Such a planarization may be performed in order to remove excess material from the formation of the contact 126. Further, the planarization may also serve to separate the first vertical portion 128 from the second vertical portion 130. This may facilitate a formation of an interconnecting structure configured to interconnect the metallization layer 104 and the fin-FET arrangement 120. In particular, the interconnecting structure may be configured to interconnect the metallization layer 104 and the fin-FET arrangement 120 via the first and second vertical portions 128, 130. The interconnecting structure will be described in conjunction to the following figure.

Referring now to FIG. 1l, an interconnecting structure 132 of the contact 126 has been formed. The interconnecting structure 132 may comprise a material being different from the first and second vertical portions 128, 130.

Referring now to FIG. 1m, a third dielectric layer 134 has been formed over the fin-FET arrangement 120. In particular, the third dielectric layer 134 may be formed on the interconnecting structure 132 and the second dielectric layer 124. The third dielectric layer 134 may be planarized subsequent to formation. The third dielectric layer 134 may provide a top dielectric layer to which a microfluidic arrangement may be bonded. Further, the second and/or third dielectric layer 124, 134 may enable that a channel can be formed configured to at least partially expose the fin-FET arrangement 120. Such a channel may be formed by removing a portion of the second and/or third dielectric layer 124, 134. By removing a portion of the second and/or third dielectric layer 124, 134, it may also be possible to form a chamber in conjunction to the fin-FET arrangement 120.

Referring now to FIG. 1n, a portion of the second and third dielectric layers 124, 134 has been removed. The etch stop layer 122 may provide for that the fin-FET arrangement 120 and/or any dielectric present under the fin-FET arrangement 120 are protected during removal of the portion of the second and third dielectric layers 124, 134.

Referring now to FIG. 1o, the etch stop layer has been removed. This may be done in order to form a fresh metal oxide layer 136 as illustrated in FIG. 1p over the fin-FET arrangement 120. The metal oxide layer 136 may also be formed on the third dielectric layer 134. As can be seen, the metal oxide layer 136 may also cover a side portion 137 of the second and/or third dielectric layer 124, 134. The metal oxide layer 136 may comprise AlO, HfO, SiO or similar materials. For instance, as mentioned above, the metal oxide layer 136 may be deposited using plasma enhanced atomic layer deposition.

As an alternative, as also discussed above, the gate 123 may form as an etch stop and instead of removing the etch stop layer 122 and forming a fresh metal oxide layer 136, the gate 123 may form an etch stop protecting the gate dielectric layer and the gate 123 may later be removed for exposing the gate dielectric layer and allowing the gate dielectric layer to make contact with charges in a fluid that may provide a gate signal.

Referring now to FIG. 1q, a portion of the interconnecting structure 132 has been exposed in order to form a bond pad opening 138. The bond pad opening may provide for that the fluid sensor device can be connected to other devices. The bond pad opening 138 may also provide for that a signal from the fin-FET arrangement can be received by another device.

Referring now to FIG. 1r, a microfluidic arrangement 140 has been bonded to the third dielectric layer 134. The bonding may be performed by fusion bonding. Here, the microfluidic arrangement 140 together with the second dielectric layer 124 and third dielectric layer 134 forms part of the channel 142. The channel 142 comprises an inlet 144 and an outlet 146. The channel 142 is configured to at least partially expose the fin-FET arrangement 120 and to allow a fluid comprising an analyte to contact the fin-FET arrangement 120.

Thus, in FIG. 1r, a fluid sensor device 100 is shown, having a fin-FET arrangement 120 over a CMOS arrangement 102, wherein an interconnecting structure 132 interconnects the metallization layer 104 of the CMOS arrangement 102 with the fin-FET arrangement 120. The fin-FET arrangement 120 is at least partially exposed in the channel 142.

The microfluidic arrangement 140 may comprise various microfluidic structures, e.g. a microfluidic structure 146 configured to facilitate the analysis of the fluid by the fluid sensor device 100. The various microfluidic structures may add additional functionality to the fluid sensor device 100. Examples of such structures include e.g. valves, filters, lysing elements, and structures configured to dilute a fluid comprising an analyte, wherein the fluid is intended to be analyzed by the fluid sensor device 100. In general, the microfluidic arrangement 140 may be configured to treat the fluid comprising the analyte, wherein the fluid is intended to contact the fin-FET arrangement 120. The microfluidic arrangement 140 may comprise an opening 148 configured to align with the bond pad opening 138.

The fluid sensor device 100 may be configured to allow selective contacting of an analyte to the fin-FETs of the fin-FET arrangement 120. The analyte may change a charge of the gate of the fin-FET arrangement 120 when forming a contact with the fin-FETs such that a conductance in the fin-FETs is changed. This may cause a current to flow from source to drain in the transistor formed by the fin-FET arrangement 120 such that a fluid sensor signal may be generated, which may be transferred to the CMOS arrangement 102 for further processing, such as amplifying of the signal.

The set-up of using fin-FETs to which analytes may form contact or be attached may be very sensitive. In an embodiment, the fluid sensor device 100 may allow sensing of a single molecule attaching to the fin-FETs.

The analyte may be any kind of substance in the fluid, such as a biological substance, e.g. a DNA or RNA string. The fluid may be liquid or gaseous, allowing sensing of analytes in a liquid or a gas.

In the above the inventive concept has mainly been described with reference to a limited number of examples. However, as is readily appreciated by a person skilled in the art, other examples than the ones disclosed above are equally possible within the scope of the inventive concept, as defined by the appended claims.

The invention claimed is:

1. A method for manufacturing a fluid sensor device, the method comprising:
    bonding a silicon-on-insulator arrangement comprising a silicon wafer, a buried oxide, a silicon layer, and a first dielectric layer, to a CMOS arrangement comprising a metallization layer and a planarized dielectric layer, wherein the bonding is performed via the first dielectric layer and the planarized dielectric layer, wherein the silicon laver comprises source and drain contact implants and forming of the source and drain contact implants of the silicon layer of the silicon-on-insulator arranqement comprises annealing at a temperature above 1000° C.;
    removing the buried oxide and the silicon wafer;
    forming a fin-FET arrangement in the silicon layer, wherein the fin-FET arrangement is configured to function as a fluid sensitive fin-FET arrangement and wherein the fin-FET arrangement comprises source and drain regions;
    forming a contact between the metallization layer and the fin-FET arrangement, wherein the contact comprises an interconnecting structure configured to interconnect the metallization layer and the fin-FET arrangement; and
    forming a channel comprising an inlet and an outlet, wherein the channel is configured to at least partially expose the fin-FET arrangement and to allow a fluid comprising an analyte to contact the fin-FET arrangement.

2. The method according to claim 1, wherein the CMOS arrangement comprises an amplifying structure configured to amplify a signal from the fin-FET arrangement.

3. The method according to claim 2, wherein the metallization layer is configured to provide contact to the amplifying structure of the CMOS arrangement.

4. The method according to claim 1, further comprising forming a second dielectric layer over the fin-FET arrangement, and wherein the contact to the metallization layer and the fin-FET arrangement is configured to be at least partially enclosed by the planarized dielectric layer and the second dielectric layer.

5. The method according to claim 4, further comprising forming a third dielectric layer over the contact and the fin-FET arrangement.

6. The method according to claim 5, wherein the step of forming the channel comprises removing a portion of the second and third dielectric layer, and bonding a microfluidic arrangement to the third dielectric layer.

7. The method according to claim 1, wherein the contact comprises a vertical arrangement comprising a first vertical portion configured to be in contact with the fin-FET arrangement, and a second vertical portion configured to be in contact with the metallization layer, wherein the interconnecting structure is configured to connect the metallization layer and the fin-FET arrangement via the vertical arrangement.

8. The method according to claim 1, further comprising forming an etch stop layer over the fin-FET arrangement prior to the step of forming the contact to the metallization layer and the fin-FET arrangement.

9. The method according to claim 8, wherein the etch stop layer comprises a material selected from the group consisting of SiN, metal oxides, and metal.

10. The method according to claim 8, wherein the etch stop layer is at least partially removed in conjunction with forming a sample chamber of the channel, and wherein a metal oxide layer is thereafter formed over the fin-FET arrangement.

11. The method according to claim 1, wherein a portion of the interconnecting structure is exposed in order to form a bond pad opening.

12. The method according to claim 1, wherein the fin-FET arrangement comprises nanopore fin-FETs.

13. A method for manufacturing a fluid sensor device, the method comprising:
   forming a fin-FET arrangement in a silicon layer of a silicon-on-insulator arrangement, comprising a silicon wafer, a buried oxide and the silicon layer, wherein the silicon layer comprises source and drain contact implants and forming of the source and drain contact implants of the silicon layer of the silicon-on-insulator arrangement comprises annealing at a temperature above 1000° C., wherein the fin-FET arrangement is configured to function as a fluid sensitive fin-FET arrangement and wherein the fin-FET arrangement comprises source and drain regions;
   bonding the silicon-on-insulator arrangement to a temporary carrier;
   removing the silicon wafer;
   bonding the temporary carrier to a CMOS arrangement comprising a metallization layer and a planarized dielectric layer, wherein the bonding is performed via a dielectric layer of the silicon-on-insulator, such as the buried oxide, and the planarized dielectric layer;
   removing the temporary carrier;
   forming a contact between the metallization layer and the fin-FET arrangement, wherein the contact comprises an interconnecting structure configured to interconnect the metallization layer and the fin-FET arrangement; and
   forming a channel comprising an inlet and an outlet, wherein the channel is configured to at least partially expose the fin-FET arrangement and to allow a fluid comprising an analyte to contact the fin-FET arrangement.

* * * * *